United States Patent [19]

Egger et al.

[11] Patent Number: 4,785,208
[45] Date of Patent: Nov. 15, 1988

[54] LOW-INDUCTANCE ANODE-CATHODE R-C CIRCUIT FOR A GATE-TURN-OFF POWER THYRISTOR

[75] Inventors: Claude Egger, Yverdon; Stefan Umbricht, Wettingen, both of Switzerland

[73] Assignee: BBC Brown, Boveri & Company, Limited, Baden, Switzerland

[21] Appl. No.: 52,213

[22] Filed: May 19, 1987

Related U.S. Application Data

[63] Continuation of Ser. No. 800,159, Nov. 20, 1985, abandoned.

[30] Foreign Application Priority Data

Nov. 28, 1984 [CH] Switzerland ............. 5676/84

[51] Int. Cl.⁴ ............................................. H03K 17/72
[52] U.S. Cl. ........................................ 307/633; 357/76
[58] Field of Search ............... 307/631, 633; 357/75, 357/76, 81

[56] References Cited

U.S. PATENT DOCUMENTS 4,392,175  7/1983  Takigami et al. ............. 307/252 C
4,492,975  1/1985  Yamada et al. ............... 357/76

FOREIGN PATENT DOCUMENTS 2251119  6/1975  European Pat. Off. .

OTHER PUBLICATIONS

GTO Inverter for AC Traction Drives, Akiteru Ueda et al., pp. 343-348, vol. 1A-19, No. 3 May/Jun. 1983.

Praxis mit dem GTO, W. Bosterling et al, pp. 14-18 Feb. 1983.

Primary Examiner—John Zazworsky
Attorney, Agent, or Firm—Oblon, Fisher, Spivak, McClelland, & Maier

[57] ABSTRACT

A low-inductance anode-cathode R-C circuit for a gate-turn-off power thyristor, including circuit diodes, capacitors and line connections for connecting the R-C circuit to a power thyristor. By reducing the spray inductances of circuit diodes, capacitors and line connections of the turn-off unloading circuit of a table-shaped power thyristor (Th), which can be designed for loads of 2500 V and 1000 A, its additional breaking current can be increased and the pulse-peak voltage of the first steep rise of the anode-cathode voltage across the power thyristor, occurring when it is switched off, can be reduced. R-C circuit diodes, capacitors and, preferably, also the power thyristor, have the same axial component direction, that is to say they are arranged axially parallel or coaxially with respect to each other in a low-induction R-C circuit arrangement. Electrically, these components are connected by means of electrically conductive plates, which essentially extend parallel to each other, and symmetrical, bell-shaped caps or wire connections between the plates and the connecting terminals of the components. In the case of the coaxial arrangement, R-C circuit diodes and capacitors are essentially electrically connected to each other without intermediate line, a coaxial cable being used for the connection to the power thyristor. Several low-inductance R-C circuit diodes and capacitors can be connected in parallel with each other and/or in series.

7 Claims, 2 Drawing Sheets

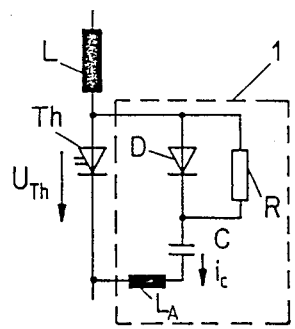
FIG.1
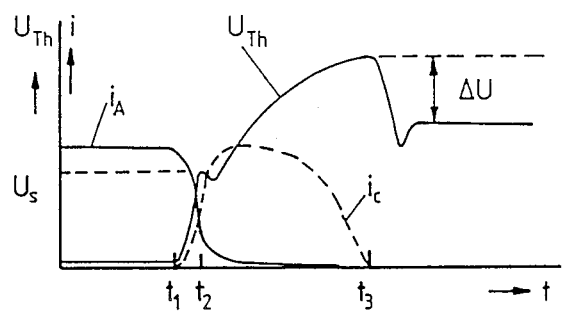
FIG.2
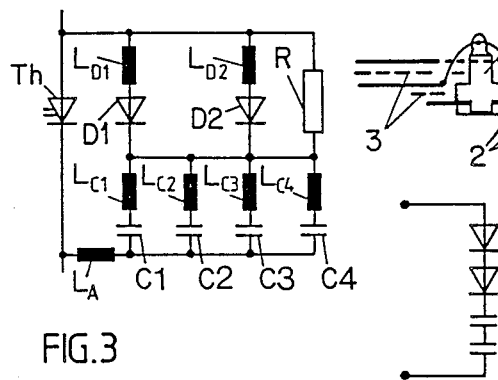
FIG.3
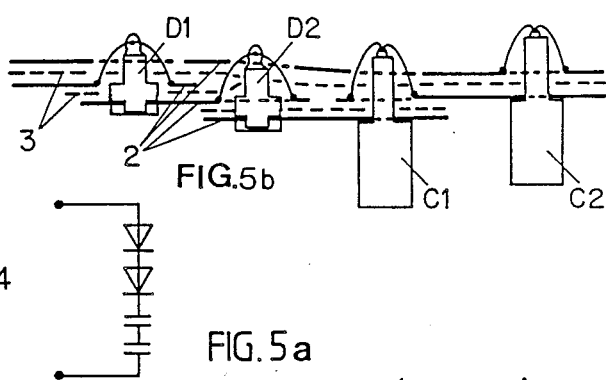
FIG.5b
FIG.5a
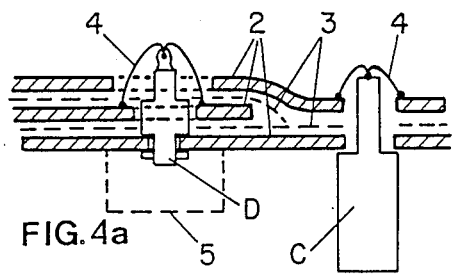
FIG.4a
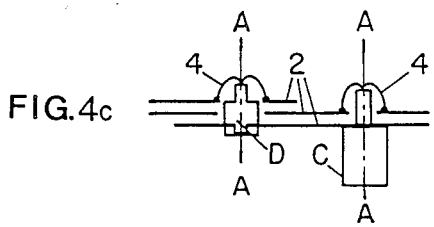
FIG.4c
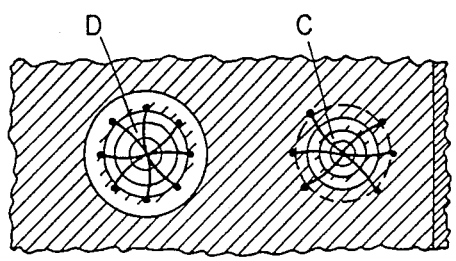
FIG.4b
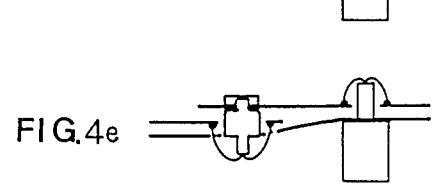
FIG.4d
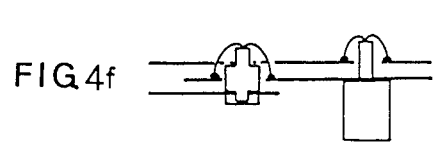
FIG.4e
FIG.4f

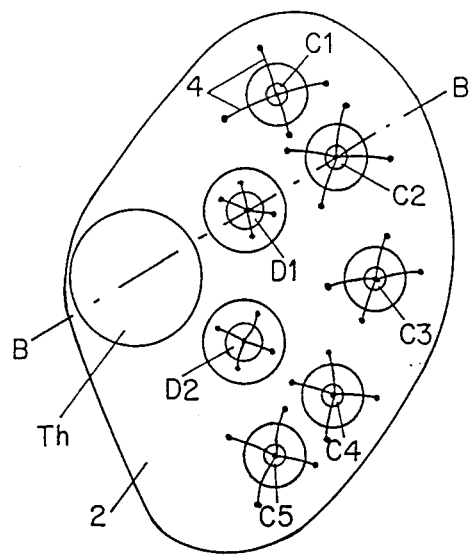
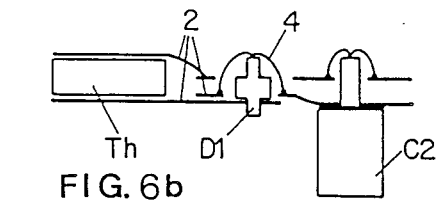
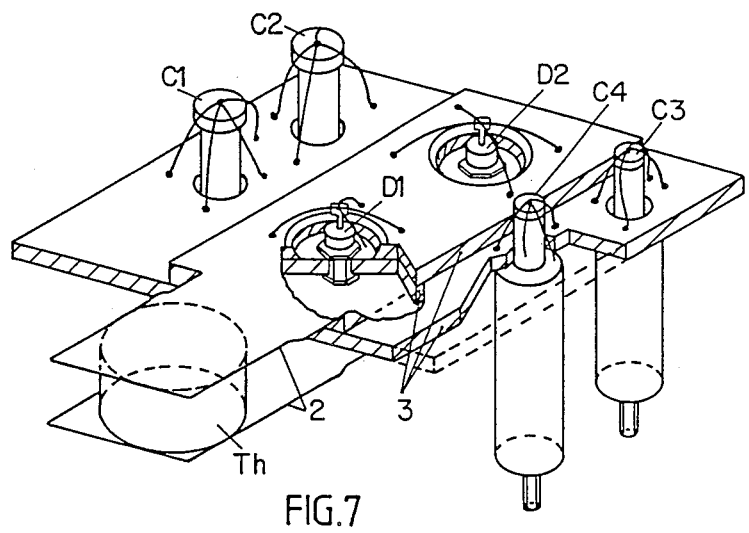
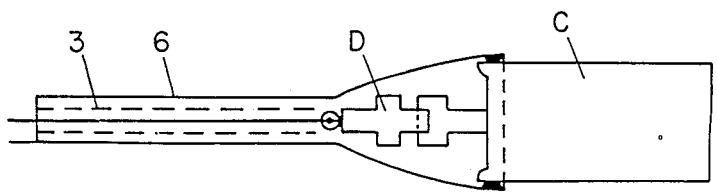
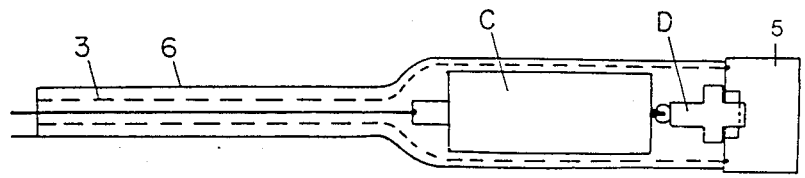

LOW-INDUCTANCE ANODE-CATHODE R-C CIRCUIT FOR A GATE-TURN-OFF POWER THYRISTOR

This application is a continuation of Ser. No. 800,159, filed on 11/20/85, now abandoned.

BACKGROUND OF THE INVENTION

1. Field of the Invention

The invention relates to a low-induction anode-cathode R-C circuit for a gate-turn-off power thyristor.

2. Discussion of Background

State of the art low-inductance anode-cathode R-C circuits for a gate-turn-off power thyristor are described in IEEE Transactions on Industry Applications, Vol. IA-19, 3(1983) pages 343-344. In this paper, two gate-turn-off thyristors, so-called GTO thyristors, which are designed for 2500 V/1000 A, are connected in parallel via current balancing chokes, for vehicle drives with a power of 600 kVA. A diode is connected in antiparallel and a turn-off un-loading circuit consisting of an R-C circuit diode in parallel with a resistor and a capacitor connected in series therewith is connected in parallel with each GTO thyristor. When the thyristor is turned off, a steep voltage rise with a peak or a pulse point is caused to occur at it, mainly due to stray inductances of the components and lines of the turn-off unloading circuit, which can lead to the thyristor being destroyed. To reduce the inductance of the turn-off unloading circuit, low-inductance capacitors and diodes and short lines, particularly flexible coaxial lines, are used.

SUMMARY OF THE INVENTION

Accordingly, one object of the invention is to provide a novel anode-cathode R-C circuit for a gate-turn-off power thyristor, which has a lower stray inductance.

The above object, and others, are achieved by providing a low-inductance anode-cathode R-C circuit of a gate-turn-off thyristor including at least one R-C circuit diode of the same polarity as the power thyristor connected in series with a capacitor, this series circuit of the R-C circuit diode and the capacitor being connected in parallel with the power thyristor, wherein low-inductance electric connections are made between the R-C circuit diode, capacitor and power thyristor, and the R-C circuit diode and the capacitor have the same axial component direction.

An advantage of the invention consists in increased breaking capacity and in increased permissible breaking current of the power thyristor and in lower switching losses.

The advantageous development of the invention wherein the R-C circuit includes plural parallel connected diodes and/or plural parallel connected low-induction capacitors results in a reduction in the total inductance of the turn-off unloading circuit by using several diodes which are connected in parallel and which are of low power and cheaper, and smaller capacitors with lower inductance.

A further reduction of the stray inductance caused by line connections is achieved by connecting the diodes and capacitors of the R-C circuit together via electrically conductive plates which extend parallel to each other and electrically to the power thyristor and by providing a power thyristor which has the same axial direction as the R-C circuit.

An advantage of locating the diodes and the capacitors of the R-C circuit at the same distance from the power thyristor, according to a further development of the invention, consists in uniformly loading the components of the turn-off unloading circuit.

The arrangement of the components of the turn-off unloading circuit along circular lines with the power thyristor at the center guarantees a clearer configuration and efficient production.

Further, if several diodes and/or capacitors are connected in series, the circuit is particularly well suited for high voltages and permits conventional and cheaper components designed for lower voltages to be used.

Constructing the electric connections of diodes and capacitors to the conductive plates to be symmetrical leads to further reduction of the stray line inductances.

Further developments of the invention result in flexible design of the turn-off unloading circuit and better cooling of the R-C circuit diode.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a circuit diagram of an anode-cathode R-C circuit of a gate-turn-off power thyristor, FIG. 2 is a graph of voltage and current versus time for explaining the function of the circuit according to FIG. 1.

FIG. 3 is a circuit diagram of an anode-cathode R-C circuit according to FIG. 1, consisting of several parallel-connected R-C diodes and capacitors, FIGS. 4a and 4b show a plate connection of an R-C circuit diode and capacitor according to FIG. 1 in section and in a top view, FIGS. 4c-4f show basic representations of different front plate connection possibilities of an R-C circuit diode and capacitor, FIGS. 5a and 5b show a basic circuit diagram of a series circuit of several R-C circuit diodes and capacitors and associated connection of these components by means of parallel conductive plates, FIG. 6a shows a circular sector arrangement of power thyristors, R-C circuit diodes and capacitors in a top view, FIG. 6b shows a simplified sectional representation of the component arrangement along a line B—B in FIG. 6a, FIG. 7 shows a partially cut-out perspective representation of an anode-cathode circuit according to FIG. 3 comprising parallel conductive plates, and FIGS. 8 and 9 show coaxial arrangements of R-C circuit diodes and capacitors.

DESCRIPTION OF THE PREFERRED EMBODIMENTS

Referring now to the drawings, wherein like reference numerals designate identical or corresponding parts throughout the several views, in FIG. 1, L designates a choke for limiting the current rise, which is electrically connected to an anode of a gate-turn-off or GTO power thyristor Th. A thyristor R-C circuit or turn-off unloading circuit 1 is connected in parallel with the power thyristor Th. The turn-off unloading circuit consists of an R-C circuit diode D which has the same polarity as the power thyristor Th, of a resistor R which is connected in parallel with the R-C circuit diode, and of a capacitor or R-C circuit capacitor C which is connected in series with the R-C circuit diode D and with the resistor R. $L_A$ designates stray inductances of the connections or feed lines to the above-mentioned components, $i_C$ designates a charging and discharging current of the capacitor C and $U_{th}$ designates a voltage from anode to cathode of the power thyristor Th.

In FIG. 2, the anode-cathode voltage $U_{th}$ of the power thyristor Th and the current i or anode current $I_A$ of the power thyristor Th and the capacitor current $i_C$ are represented in arbitrary units as a function of time t. At the turn-off time $t_1$, the power thyristor is turned off by applying a negative gate voltage or a gate current. The anode current $i_A$ of the power thyristor Th initially drops slowly, then steeply up to a time $t_2$ and finally slowly again. During the turning-off process, the anode current $i_A$ essentially commutates to an R-c circuit path through the R-C circuit diode D, the capacitor C and the stray inductance $L_A$, the current $i_C$ initially rising steeply, then decreasing again after reaching a maximum, and reaching the value zero at a time $t_3$. Due to the current change di/dt in the R-C circuit path, a first steep short-term voltage change $dU_{th}/dt$ is produced across $L_A$, which leads to a steep increase in the anode-cathode voltage $U_{th}$ with a first maximum at a pulse peak voltage $U_S$ at time $t_2$. After a slight voltage drop, the anode-cathode voltage $U_{th}$ of the power thyristor Th rises up to a second maximum at time $t_3$ due to the capacitor C charging up and then remains at an almost constant value after a subsequent drop.

A reduction of the pulse peak voltage $U_S$, which is proportional to $L_A$, is of particular importance since a high pulse peak voltage leads to high power dissipation and thus to a high development of heat in the power thyristor Th, particularly during the time interval $t_2-t_1$. If the pulse peak voltage $U_S$ exceeds a critical value, the power thyristor Th is destroyed during this turning-off process. A reduction of the pulse peak voltage $U_S$ also results in a reduction of the switching losses in the power thyristor Th. For these reasons, the stray inductance should be as small as possible.

A possibility for reducing the stray inductance is shown in FIG. 3. In this illustration, two R-C circuit diodes D1 and D2, having internal stray inductances $L_{D1}$ and $L_{D2}$, are connected in parallel so that the resultant stray inductance is smaller in comparison with using only one R-C circuit diode D in accordance with the circuit shown in FIG. 1. In addition, four capacitors C1 ... C4, having internal stray inductances $L_{C1}$ ... $L_{C4}$, are connected in parallel, of which each capacitor has ¼ of the nominal capacitance of the turn-off unloading circuit. The stray inductance of these parallel-connected capacitors is lower than the stray inductances of only one capacitor C having nominal capacitance.

A possibility for reducing the stray inductance of the line connections $L_A$ of the components can be seen in FIG. 4a. Conductive plates of copper, aluminum or a high-conductivity, corrosion-resistant alloy, essentially extending in parallel with each other, are designated by 2, insulation layers of an electrically insulating, corrosion-resistant material are designated by 3, metal wires which electrically connect the electric connecting terminals of the R-C circuit diode D and the R-C circuit capacitor C to corresponding conductive plates 2 are designated by 4, and a heat sink is designated by 5. The heat sink 5 is in good thermal contact with the R-C circuit diode D, see FIG. 4a.

FIG. 4b shows the plate connection of FIG. 4a in top view. Several symmetrically arranged wires 4 are provided for the electric connection of the components.

FIGS. 4c to 4f show diagrammatically connection possibilities, which are different with respect to FIG. 4a, of R-C circuit diode D, capacitor C and conductive plates 2, the insulations 3 and the heat sink 5 having been omitted for the sake of simplicity. As in FIGS. 4a and 4b, the R-C circuit diode D and capacitor C according to FIGS. 4c to 4f have the same axial direction A—A with respect to their three-dimensional shape. In the case shown, the components are arranged axially parallel to each other.

FIG. 5a shows a series circuit of several R-C circuit diodes D and capacitors C for high voltages and FIG. 5b shows an associated circuit possibility comprising parallel conductive plates 2 and interposed insulation layers 3.

According to FIG. 6a, two R-C circuit diodes D1, D2 and five capacitors C1 ... C5 are in each case arranged along circular lines around power thyristor Th at the centre of the circle. The conductive plates 2 of which only the topmost is shown in top view, are designed in the shape of a circular sector. FIG. 6b shows the connections of the components Th, D and C to conductive plates 2 in a section along a section line B—B in FIG. 6a.

In the perspective view of the embodiment of the invention according to FIG. 7, four capacitors are connected in parallel with each other by means of conductive plates 2 and are arranged to be symmetrical to two R-C circuit diodes D1 and D2, also connected in parallel, according to the circuit according to FIG. 3. The tablet-shaped power thyristor Th, the diodes D1 and D2 and the capacitors C1 ... C4 are aligned to be axially parallel to each other.

In the embodiments shown in FIGS. 8 and 9, the R-C circuit diode D and the capacitor C are arranged coaxially to each other and directly electrically connected to each other. Thus a connecting line between these components can be virtually eliminated. The electric return or the connection to the power thyristor, not shown, is ensured via a coaxial screen 6 or via a coaxial cable. 3 again designates an insulation layer. In comparison with the arrangement shown in FIG. 8, that shown in FIG. 9 has the advantage that the R-C circuit diode D can be provided in simple manner with a heat sink 5.

The R-C circuit diodes and the capacitors are preferably of low-inductance construction. In addition, it is of advantage if, instead of the wires 4, bell-shaped electrically highly conductive caps are used for the connections of the contact terminals of the R-C circuit diodes and capacitors to the conductive plates 2 in the component arrangements according to the invention. If these measures are used, the turn-off current of the power thyristor Th can be increased by about 30% in comparison with the known R-C circuit initially mentioned.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A gate turn-off thyristor circuit comprising:
a gate turn-off thyristor;
a snubber circuit connected in parallel to the gate turn-off thyristor, said snubber circuit comprising,
at least one snubber diode, and
at least one snubber capacitor;
said gate turn-off thyristor, said at least one snubber diode and said at least one snubber capacitor each having electrically opposed terminals or respective contact surfaces and a geometrical major axis;
said gate turn-off thyristor, said at least one snubber diode and said at least one snubber capacitor connected with each other via electrically conductive plates which essentially extend parallel to each other and which are electrically isolated with respect to each other; and
said gate turn-off thyristor, said at least one snubber diode and said at least one snubber capacitor arranged so that their respective geometrical major axes are parallel within the gate turn-off thyristor circuit.

2. A gate turn-off thyristor circuit according to claim 1, wherein said at least one snubber diode comprises plural snubber diodes and said at least one snubber capacitor comprises plural snubber capacitors, wherein
the snubber diodes are located at the same distance from the gate turn-off thyristor, and
the snubber capacitors are located at the same distance from the gate turn-off thyristor.

3. A gate turn-off thyristor circuit according to claim 1, wherein the at least one snubber diode and the at least one snubber capacitor have plural symmetrically arranged electrical connections to the conductive plates.

4. A gate turn-off thyristor circuit according to claim 2, wherein plural of said snubber diodes are connected in parallel and plural of said snubber capacitors are connected in parallel.

5. A gate turn-off thyristor circuit according to claim 2, wherein plural of said snubber diodes are connected in series.

6. A gate turn-off thyristor circuit according to claim 4, wherein plural of said snubber diodes are connected in series.

7. A gate turn-off thyristor circuit according to claim 2, 4, 5 or 6, wherein plural of said snubber capacitors are connected in series.

* * * * *